United States Patent
Cheng et al.

(10) Patent No.: US 12,402,545 B2
(45) Date of Patent: Aug. 26, 2025

(54) STACKED CROSS-POINT PHASE CHANGE MEMORY

(71) Applicant: International Business Machines Corporation, Armonk, NY (US)

(72) Inventors: Kangguo Cheng, Schenectady, NY (US); Carl Radens, LaGrangeville, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 747 days.

(21) Appl. No.: 17/545,635

(22) Filed: Dec. 8, 2021

(65) Prior Publication Data

US 2023/0180640 A1 Jun. 8, 2023

(51) Int. Cl.
- H10B 63/00 (2023.01)
- H10N 70/00 (2023.01)
- H10N 70/20 (2023.01)

(52) U.S. Cl.
CPC .......... H10N 70/231 (2023.02); H10B 63/84 (2023.02); H10N 70/021 (2023.02); H10N 70/826 (2023.02); H10N 70/841 (2023.02); H10N 70/882 (2023.02)

(58) Field of Classification Search
CPC ............................. H10B 63/00; H10N 70/00
See application file for complete search history.

(56) References Cited

U.S. PATENT DOCUMENTS

| | | | |
|---|---|---|---|
| 8,129,705 B2 | 3/2012 | Kinoshita et al. |
| 9,570,516 B2 | 2/2017 | Shepard |
| 9,793,323 B1 | 10/2017 | Lung et al. |
| 10,262,730 B1 | 4/2019 | Nardi et al. |
| 10,707,417 B1 | 7/2020 | Bruce et al. |
| 10,971,546 B2 | 4/2021 | Carta et al. |
| 2020/0295087 A1 | 9/2020 | Kawasumi et al. |

FOREIGN PATENT DOCUMENTS

| | | |
|---|---|---|
| CN | 102449701 A | 5/2012 |
| CN | 103370745 A | 10/2013 |
| CN | 111739904 A | 10/2020 |
| CN | 112041997 A | 12/2020 |
| CN | 112567525 A | 3/2021 |
| CN | 112585759 A | 3/2021 |

(Continued)

OTHER PUBLICATIONS

Anonymous, "Method and Structure to Fabricate 3D Cross Point Phase Change Memory", IP.com No. PCOM000261458D, IP.com No. IPCOM000261458D, 10 pages.

(Continued)

*Primary Examiner* — Marvin Payen
(74) *Attorney, Agent, or Firm* — Scully, Scott, Murphy & Presser, P.C.; Yuanmin Cai

(57) ABSTRACT

A stacked phase change memory structure having a cross-point architecture is provided. The stacked phase change memory structure includes at least two phase change material element-containing structures stacked one atop the other. Each phase change material element-containing structure of the plurality of phase change material element-containing structures has a cross-point architecture and includes, from bottom to top, at least one bottom electrode, a phase change material element, and a top electrode.

20 Claims, 13 Drawing Sheets

(56) References Cited

FOREIGN PATENT DOCUMENTS

| | | |
|---|---|---|
| CN | 112655092 A | 4/2021 |
| CN | 112840460 A | 5/2021 |
| CN | 113096706 A | 7/2021 |
| CN | 113439335 A | 9/2021 |
| CN | 113629099 A | 11/2021 |
| JP | 2012244109 A | 12/2012 |
| WO | 2020213968 A1 | 10/2020 |

OTHER PUBLICATIONS

International Search Report dated Dec. 15, 2022, received in a corresponding foreign application, 10 pages.

STACKED CROSS-POINT PHASE CHANGE MEMORY

BACKGROUND

The present application relates to a memory structure, and more particularly to a stacked phase change memory structure having a cross-point architecture.

Phase change memory (PCM) has been pursued for a variety of applications such as, for example, a storage class memory as well as storing weights of neural networks for artificial intelligence. It is highly desired to increase the PCM cell density.

Cross-point memory architecture is particularly attractive. In cross-point memory, a memory cell occurs at an overlap between a wordline and a bitline. Specifically, a memory element material such as a phase change material is provided between the wordline and bitline. However, it is extremely challenging, and is some circumstances impossible, to form a stacked cross-point PCM. For example, in conventional stacked cross-point PCMs, each layer of the PCM has to be fabricated sequentially. If a ten layer stacked PCM is desired, such a sequential fabrication approach results in a high process cost as the cost is proportional to the number of PCM layers. There is thus a need for a method of forming a stacked cross-point PCM in a cost-efficient manner.

SUMMARY

A stacked phase change memory structure having a cross-point architecture is provided. The term "cross-point architecture" is used throughout the present application to denote a memory element sandwiched between two orthogonal electrodes.

In one aspect of the present application, a memory structure is provided. In one embodiment, the memory structure includes a plurality of phase change material element-containing structures stacked one atop the other. Each phase change material element-containing structure of the plurality of phase change material element-containing structures has a cross-point architecture and includes, from bottom to top, at least one bottom electrode, a phase change material element, and a top electrode. At least one bitline is located orthogonal to each phase change material element-containing structure of the plurality of phase change material element-containing structures. The at least one bitline has an inner sidewall that is in direct physical contact with a sidewall of the at least one bottom electrode of each phase change material element-containing structure of the plurality of phase change material element-containing structures.

In another embodiment, the memory structure includes a plurality of phase change material element-containing structures stacked one atop the other, wherein each phase change material element-containing structure of the plurality of phase change material element-containing structures has a cross-point architecture and includes, from bottom to top, a plurality of spaced apart and electrically isolated bottom electrodes, a phase change material element, and a top electrode. A plurality of bitlines are located orthogonal to each phase change material element-containing structure of the plurality of phase change material element-containing structures, wherein each bitline of the plurality of bitlines has an inner sidewall that is in direct physical contact with a sidewall of one of the bottom electrodes of the plurality of spaced apart and electrically isolated bottom electrodes of each phase change material element-containing structure of the plurality of phase change material element-containing structures.

In another aspect of the present application, a method of forming a memory structure is provided. In one embodiment, the method includes forming a pillar structure containing a plurality of stacked phase change memory (PCM)-containing material stacks, wherein each stack is spaced apart by a dielectric material layer, and each PCM-containing material stack includes a bottom electrode layer portion, a phase change material layer portion, and a top electrode layer portion. The phase change material layer portion of the pillar structure is then laterally recessed to provide a phase change material element, and thereafter a first dielectric inner spacer is formed laterally adjacent to each phase change material element. Each top electrode layer portion of the pillar structure is then laterally recessed to provide a top electrode, and thereafter a second dielectric inner spacer is formed laterally adjacent to each top electrode. At least one bitline is then formed orthogonal to the pillar structure, and thereafter each bottom electrode layer portion of the pillar structure is isotropically etched utilizing the at least one bitline as an etch mask to provide at least one bottom electrode. Next, a dielectric material structure sealing each bottom electrode is formed.

DETAILED DESCRIPTION

Figure 1:
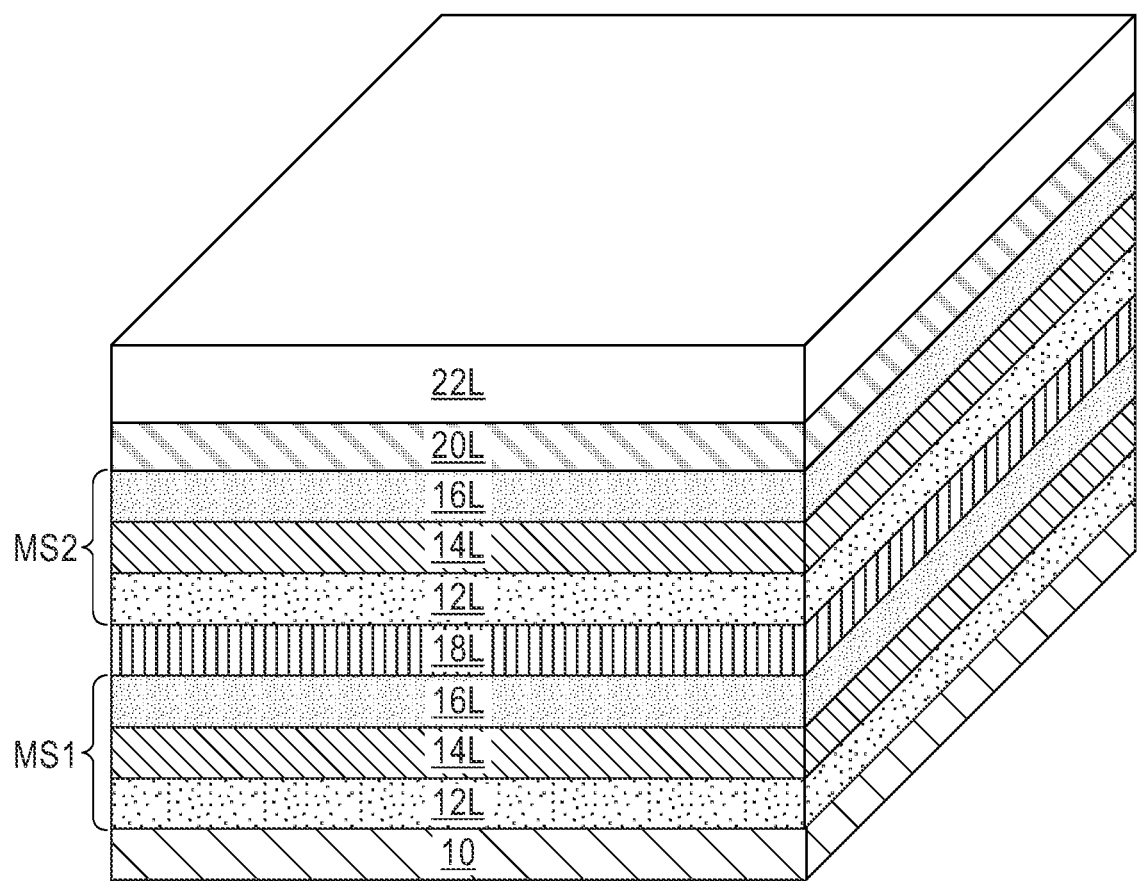
FIG. 1 is a three-dimensional (3D) view of an exemplary structure that can be employed in accordance with an embodiment of the present application, the exemplary structure including at least two PCM-containing material stacks located one atop the other, wherein each PCM material stack includes a bottom electrode layer, a phase change material layer, and a top electrode layer, and wherein a dielectric material layer is present atop each of the at least two PCM-containing material stacks.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a three-dimensional (3D) view of an exemplary structure that can be employed in accordance with an embodiment of the present application. The exemplary structure includes at least two PCM-containing material stacks MS1 and MS2 located one atop the other, wherein each PCM material stack includes a bottom electrode layer 12L, a phase change material layer 14L, and a top electrode layer 16L. The at least two PCM-containing material stacks MS1 and MS2 are located on a surface of substrate 10. The number of PCM-containing material stacks that can be present in the exemplary structure can vary and is not limited to two. For example, the exemplary structure can include 3, 4, 5, 6, . . . 5, . . . etc. number of PCM-containing material stacks. Thus, the present application can work when a plurality of PCM-containing material stacks are present.

In accordance with the present application, a dielectric material layer is present atop each of the PCM-containing material stacks. Notably and for the illustrated embodiment shown in FIG. 1, dielectric material layer 18L is located atop the first PCM-containing material stack MS1 and dielectric material layer 20L is located atop the second PCM-containing material stack MS2. A hard mask layer 22L is located above the topmost dielectric material layer (e.g., and in the illustrated embodiment dielectric material layer 20L) that is present on the topmost PCM-containing material stack (e.g., and in the illustrated embodiment the second PCM-containing material stack MS2).

Substrate 10 can include a front-end-of-the-level (FEOL), a middle-of-the line (MOL) level and/or at least one interconnect level of a multilevel interconnect (i.e., back-end-of-the-line (BEOL) structure. Typically, substrate 10 includes a FEOL, a MOL level and at least one interconnect level. In such an embodiment, the plurality of PCM-containing material stacks (e.g., the first PCM-containing material stack MS1 and the second PCM-containing material stack MS2) are formed in the BEOL. The FEOL can include a semiconductor substrate having one or more semiconductor devices (such as, for example, transistors) formed thereon. The MOL level can include an MOL dielectric material that includes one or more electrically conductive contact structures embedded therein. The least one interconnect level can include an interconnect dielectric material layer having one or more electrically conductive interconnect structure embedded therein. So not to obscure the memory structure of the present application, the materials and techniques used in providing the FEOL, MOL and the at one interconnect level are not described in the present application.

As mentioned above, each PCM-containing material stack (including the first PCM-containing material stack MS1 and the second PCM-containing material stack MS2) that is formed includes bottom electrode layer 12L, phase change material layer 14L, and top electrode layer 16L. Each bottom electrode layer 12L is composed of a first electrically conductive electrode material. Illustrative examples of first electrically conductive electrode materials that can be used in providing each bottom electrode layer 12L include, but are not limited to, titanium nitride (TiN), tantalum nitride (TaN), ruthenium (Ru), cobalt (Co), nickel (Ni), copper (Cu), tungsten (W), tungsten nitride (WN), silver (Ag), platinum (Pt), palladium (Pd), aluminum (Al), or any suitable combination of those materials. Each bottom electrode layer 12L can include a single first electrically conductive electrode material or a multilayered stack of first electrically conductive materials. Each bottom electrode layer 12L can be formed utilizing a deposition process such as, for example, chemical vapor deposition (CVD), plasma enhanced chemical vapor deposition (PECVD), physical vapor deposition (PECVD), atomic layer deposition (ALD), sputtering or plating. Each bottom electrode layer 12L can have a thickness from 10 nm to 200 nm; although other thicknesses are contemplated and can be used in the present application as the thickness of each bottom electrode layer 12L. In embodiments, each bottom electrode layer 12L can be composed of a compositionally same first electrically conductive electrode material. In other embodiments, compositionally different first electrically conductive electrode materials can be employed.

Each phase change material layer 14L includes any material that undergoes a phase change from crystalline to amorphous or vice versa when energy is applied thereto. Such a material can be referred to herein as a phase change material. In embodiments, the phase change material that can be used in the present application for each phase change material layer 14L includes a chalcogenide that contains an element from Group 16 (i.e., a chalcogen) of the Periodic Table of Elements and a more electropositive element. Examples of chalcogens that can be used as the phase change material include, but are not limited to, a GeSbTe alloy (GST), a SbTe alloy, or an InSe alloy. Other materials such as, for example, $Cr_2Ge_2Te_6$ (CrGeT), can also be used as the phase change material so long as the other material can retain separate amorphous and crystalline states. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), tantalum oxide ($Ta_2O_5$), hafnium oxide ($HfO_2$), zirconium oxide ($ZrO_2$), cerium oxide ($CeO_2$), silicon nitride (SiN), silicon oxynitride (SiON), etc.

Each phase change material layer 14L can be formed utilizing a deposition process such as, for example, CVD, PECVD, PVD, or ALD. Each phase change material layer 14L can have a thickness from 10 nm to 100 nm; although other thicknesses are contemplated and can be used in the present application as the thickness of the phase change material layer 14L. In embodiments, each phase change material layer 14L can be composed of a compositionally same phase change material. In other embodiments, compositionally different phase change materials can be employed.

Although not shown in the drawings of the present application, a selector such as an ovanic threshold switching structure or diode can be portioned above, below, or above and below each phase change material layer 14L. That is, a selector can be positioned between the phase change material layer 14L and the bottom electrode layer 12L, or between the phase change material layer 14L and the top electrode layer 16L or between both the phase change material layer 14L and the bottom electrode layer 12L, and the phase change material layer 14L and the top electrode layer 16L. The selector can be formed utilizing techniques well known to those skilled in the art.

Each top electrode layer 16L is composed of a second electrically conductive electrode material which is compositionally different from the first electrically conductive electrode material that provides each bottom electrode 12L. Illustrative examples of second electrically conductive electrode materials that can be used in providing each top electrode layer 16L include one of the electrically conductive electrode materials mentioned above for the bottom electrode layers 12L. Each top electrode layer 16L can include a single second electrically conductive electrode material or a multilayered stack of second electrically conductive materials. Each top electrode layer 16L can be formed utilizing one of the deposition processes mentioned above in forming each bottom electrode layer 12L. Each top electrode layer 16L can have a thickness from 10 nm to 100 nm; although other thicknesses are contemplated and can be used in the present application as the thickness of the top electrode layer 16L. In embodiments, each top electrode layer 16L can be composed of a compositionally same second electrically conductive electrode material; but different from the first electrically conductive electrode material. In other embodiments, compositionally different second electrically conductive electrode materials can be employed, but different from the first electrically conductive electrode material.

Each dielectric material layer (e.g., dielectric material layers 18L and 20L; it is noted that dielectric material layer 18L can be referred to as a first dielectric material layer, while dielectric material layer 20L can be referred to as a second dielectric material layer) that is formed atop the PCM-containing material stack (e.g., the first PCM-containing material stack MS1 and the second PCM-containing material stack MS2) includes any dielectric material having electrically insulating properties. In the present application, the number of dielectric material layers equals the number of PCM-containing material stacks that are formed. In embodiments, dielectric material layer (e.g., dielectric material layers 18L and 20L) can be composed of a compositionally same electrically insulating material. In other embodiments, compositionally different electrically insulating materials can be employed. Each dielectric material layer (e.g., dielectric material layers 18L and 20L) can be formed utilizing a deposition process such as, for example, CVD, PECVD, ALD or PVD. Each dielectric material layer (e.g., dielectric material layers 18L and 20L) can have a thickness from 10 nm to 50 nm; although other thicknesses are contemplated and can be used in the present application as the thickness of the dielectric material layer (e.g., dielectric material layers 18L and 20L).

The hard mask layer 22L is composed of any dielectric hard mask material such as, for example, silicon nitride. The dielectric hard mask material that provides the hard mask layer 22L is compositionally different from at least the topmost dielectric material layer that is formed on the topmost PCM-containing material stack (e.g., and in the illustrated embodiment hard mask layer 22L is compositionally different from dielectric material layer 20L). The hard mask layer 22L can be formed utilizing a deposition process such as, for example, CVD, PECVD, ALD or PVD. The hard mask layer 22L can have a thickness from 10 nm to 50 nm; although other thicknesses are contemplated and can be used in the present application as the thickness of the hard mask layer 22L.

Figure 2:
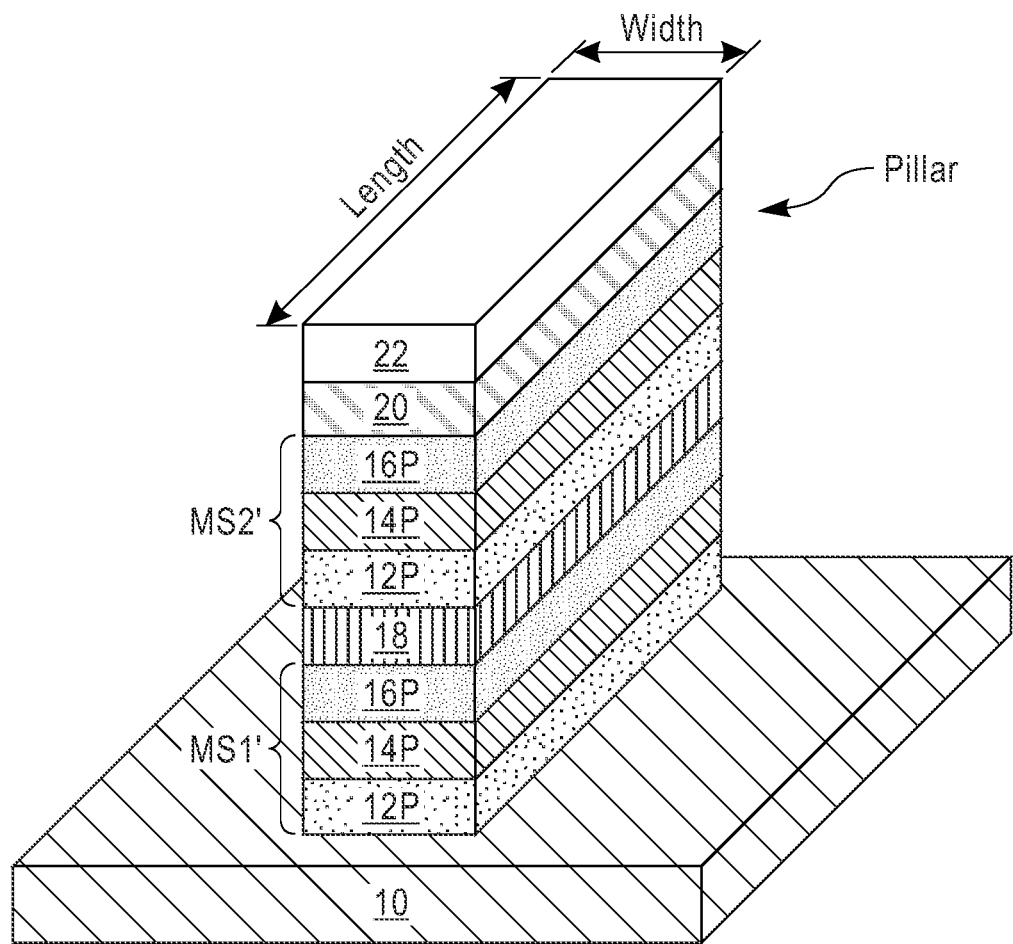
FIG. 2 is a 3D view of the exemplary structure shown in FIG. 1 after patterning the at least two PCM-containing material stacks and the dielectric material layers to provide a pillar structure containing a remaining portion of the at least two PCM-containing material stacks and a remaining portion of each dielectric material layer, each remaining portion of the PCM-containing material stacks includes a bottom electrode layer portion, a phase change material layer portion, and a top electrode layer portion.

Referring now to FIG. 2, there is illustrated the exemplary structure shown in FIG. 1 after patterning the at least two PCM-containing material stacks (e.g., MS1 and MS2) and the dielectric material layers (e.g., dielectric material layers 18L and 20L) to provide a pillar structure containing a remaining portion of the at least two PCM-containing material stacks and a remaining portion of each dielectric material layer, each remaining portion of the PCM-containing material stacks includes a bottom electrode layer portion 12P, a phase change material layer portion 14P, and a top electrode layer portion 16P. It is noted that the pillar structure also includes a remaining portion of the hard mask layer 22L (hereinafter hard mask 22) and, if present, a remaining portion of the selector (not shown). Although the present application describes and illustrates a single pillar structure, the present application is not limited to forming only a single pillar structure. Instead, the present application contemplates embodiments in which a plurality of spaced apart pillar structures are formed on the substrate 10.

The patterning includes forming a layer of photoresist material (not shown) on the surface of the hard mask layer 22L. The layer of photoresist material is then exposed to a pattern of irradiation and thereafter the exposed layer of photoresist material is developed to provide a patterned photoresist (not shown) on the hard mask layer 22L. The pattern provided by the patterned photoresist is then transferred into the hard mask layer 22L, each dielectric material layer (e.g., dielectric material layers 18L and 20L), and each PCM-containing material stack (e.g., the first PCM-containing material stack MS1 and the second PCM-containing material stack MS2) utilizing one or more etching processes. The one or more etching processes stop on a surface of substrate 10. The one or more etching processes include dry etching, wet etching or any combination thereof. In some embodiments, the patterned photoresist is removed from the structure immediately after the pattern is transferred into the hard mask layer 22L. In other embodiments, the patterned photoresist is removed from the structure anytime after the pattern has been transferred into the material layers that are located beneath the hard mask layer 22L. In any of the aforementioned embodiments, the patterned photoresist can be removed utilizing a conventional resist removal process such as, for example, ashing.

The one or more etching processes remove portions of the hard mask layer 22L, portions of each dielectric material layer (e.g., dielectric material layers 18L and 20L) and portions of each PCM-containing material stack (e.g., MS1 and MS2) that are not located directly beneath the patterned photoresist. The remaining portions are thus un-etched portions of the exemplary structure shown in FIG. 1. The remaining portion of the hard mask layer 22L can be referred to as hard mask 22, the remaining portion of each dielectric material layer can be referred to herein as a dielectric material cap (thus and in the illustrated embodiment a first dielectric material cap 18 and a second dielectric material cap 20 are formed), the remaining portion of the each PCM-containing material stack (e.g., the first PCM-containing material stack MS1 and the second PCM-containing material stack MS2) can be referred to as a patterned PCM-containing material stack (in the illustrated embodiment first patterned PCM-containing structure MS1' and second patterned PCM-containing material stack MS2' are formed). Each patterned PCM-containing material stack includes a remaining portion of the bottom electrode layer (hereinafter bottom electrode layer portion 12P), a remaining portion of the phase change material 14L (hereinafter phase change material portion 14P) and a remaining portion of the top electrode layer 16L (hereafter top electrode layer portion 16P). Each bottom electrode layer portion 12P, phase change material layer portion 14P and top electrode layer portion 16P has a length that is greater than its width.

Figure 3:
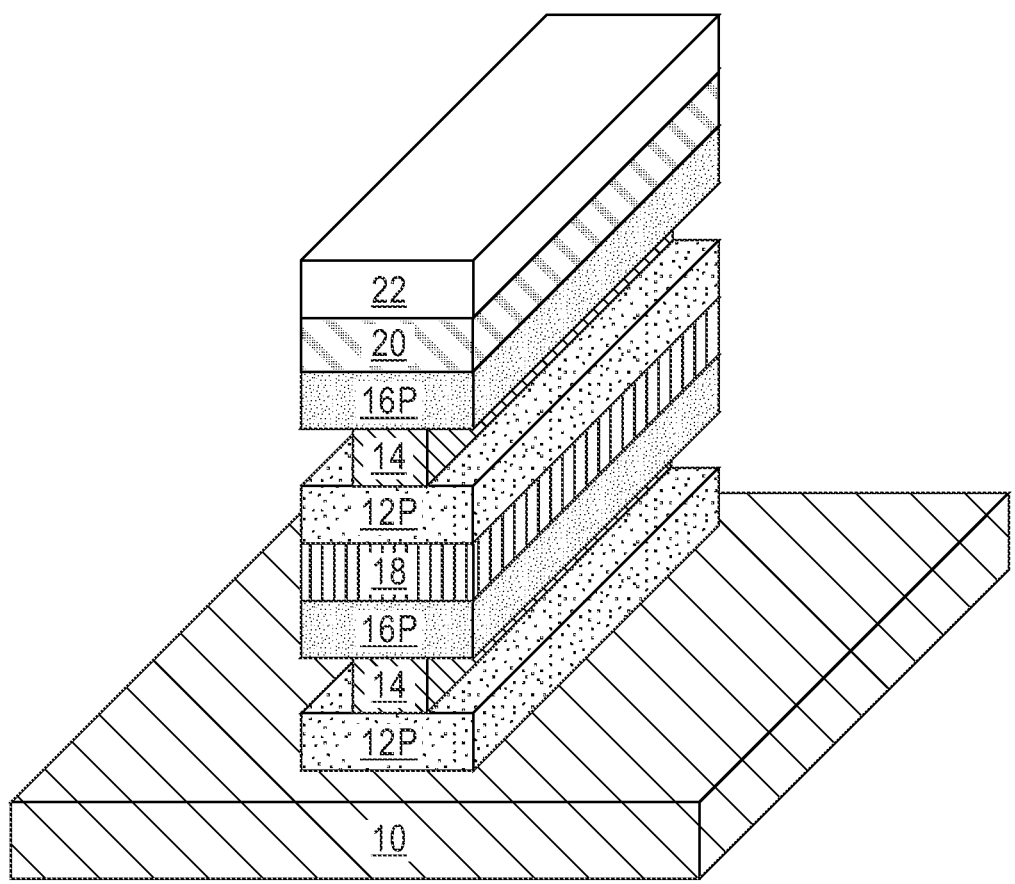
FIG. 3 is a 3D view of the exemplary structure shown in FIG. 2 after laterally recessing each phase change material layer portion of the pillar structure to provide a phase change material element.

Referring now to FIG. 3, there is illustrated the exemplary structure shown in FIG. 2 after laterally recessing each phase change material layer portion 14P of the pillar structure to provide a phase change material element 14. The lateral recessing of each phase change material layer portion 14P forms indents into the pillar structure that are located above each bottom electrode layer portion 12P and beneath each top electrode layer portion 16P as is shown in FIG. 3. The lateral recessing includes an etch that is selective in removing the phase change material that provides each phase change material layer portion 14P. It is noted that this etch removes end portions of each phase change material layer portion 14P, not an entirety of each phase change material layer portion 14P. The phase change material element 14 that is formed by this laterally recessing has a reduced width as compared to the phase change material layer portion 14P; the length stays the same.

Figure 4:
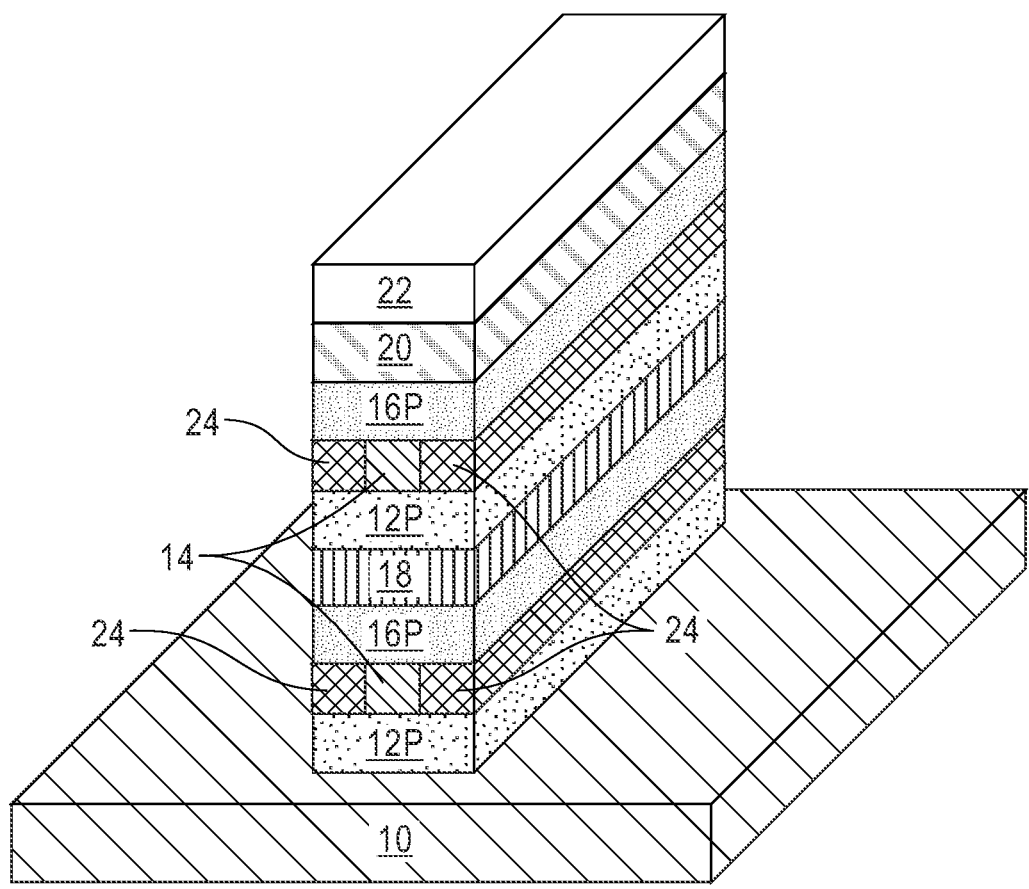
FIG. 4 is a 3D view of the exemplary structure shown in FIG. 3 after forming a first dielectric inner spacer laterally adjacent to each phase change material element.

Referring now to FIG. 4, there is illustrated the exemplary structure shown in FIG. 3 after forming a first dielectric inner spacer 24 laterally adjacent to phase change material element 14. The first dielectric inner spacer 24 is composed of a first spacer dielectric material such as, for example, silicon oxide, SiCO, SiCOH, silicon nitride or silicon oxynitride. The first dielectric spacer material can be compositionally the same as, or compositionally different from, the dielectric material that provides the dielectric material layers 18L and 20L. The forming of the first dielectric inner spacer 24 includes conformal deposition of the first dielectric spacer material, followed by etching back the as-deposited first dielectric spacer material. As is illustrated in FIG. 4, each first dielectric inner spacer 24 has an outermost sidewall that is vertically aligned to the outermost surface of the hard mask 22, the first and second dielectric material caps 18 and 20, respectively, each top electrode layer portion 16P and each bottom electrode layer portion 12P.

Figure 5:
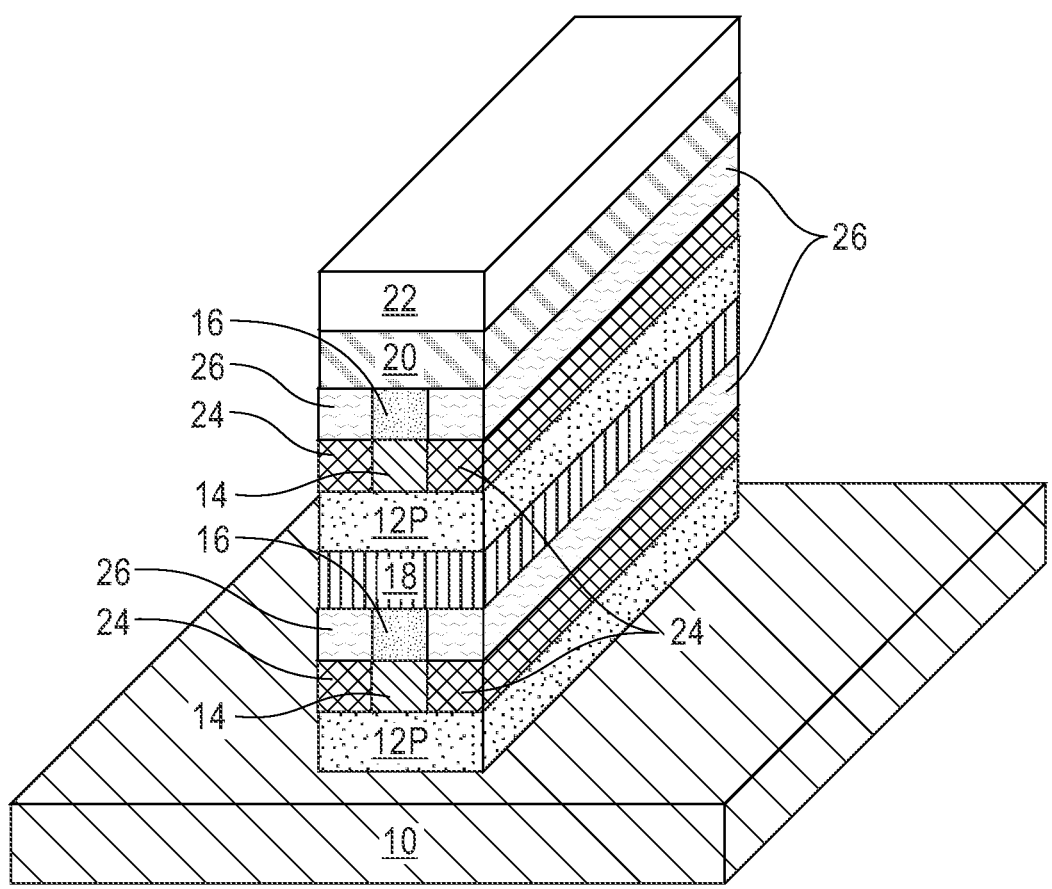
FIG. 5 is a 3D view of the exemplary structure shown in FIG. 4 after laterally recessing each top electrode layer portion of the pillar structure to provide a top electrode and forming a second dielectric inner spacer laterally adjacent to each top electrode.

Referring now to FIG. 5, there is illustrated the exemplary structure shown in FIG. 4 after laterally recessing each top electrode layer portion 16P of the pillar structure to form a top electrode 16 and forming a second dielectric inner spacer 26 laterally adjacent to each top electrode 16. The laterally recessing of each top electrode layer portion 16P forms indents into the pillar structure that are located above each first inner dielectric spacer 24 and beneath the dielectric material caps 18 and 20. The lateral recessing includes an etch that is selective in removing the second electrically conductive material that provides each top electrode layer portion 16P. It is noted that this etch removes end portions of each top electrode layer portion 16P, not an entirety of each top electrode layer portion 16P. Also, and since the first electrically conductive material that provides each bottom electrode layer portion 12P is compositionally different from the second electrically conductive material that provides each top electrode layer portion 16P, this etch does not remove any of the bottom electrode layer portion 12P. The top electrode 16 has a reduced width as compared to the top electrode layer portion 16P; the length remains the same.

After laterally recessing each top electrode layer portion 16P to provide the top electrode 16, second dielectric inner spacer 26 is formed laterally adjacent to each top electrode 16. The second dielectric inner spacer 26 is formed on each first dielectric inner spacer 24. The second dielectric inner spacer 26 is composed of a second spacer dielectric material which can be compositionally the same as, or compositionally different from, the first dielectric spacer material that provides each first dielectric inner spacer 24 and/or the dielectric material that provides the dielectric material layers 18L and 20L. Illustrative examples of second dielectric spacer materials that can be used in providing the second dielectric inner spacer 26 include, but are not limited to, silicon oxide, SiCO, SiCOH, silicon nitride or silicon oxynitride. The forming of the second dielectric inner spacer 26 includes conformal deposition of the second dielectric spacer material, followed by etching back the as-deposited second dielectric spacer material. As is illustrated in FIG. 5, each second dielectric inner spacer 26 has an outermost sidewall that is vertically aligned to the outermost surface of the hard mask 22, the first and second dielectric material caps 18 and 20, respectively, each first dielectric inner spacer 24 and each bottom electrode 12.

Figure 6:
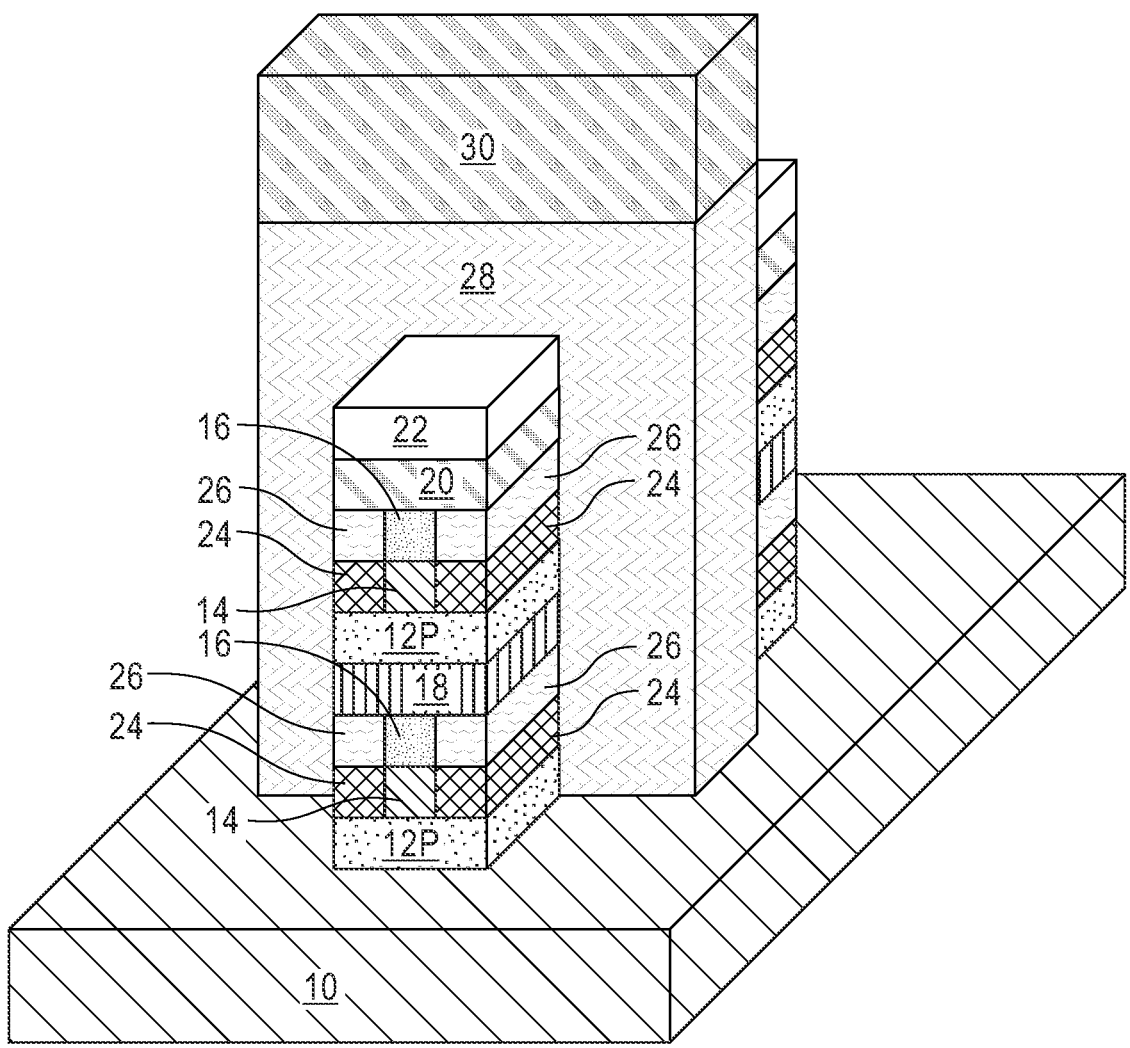
FIG. 6 is a 3D view of the exemplary structure shown in FIG. 5 after forming a bitline orthogonal to the pillar structure.

Referring now to FIG. 6, there is illustrated the exemplary structure shown in FIG. 5 after forming a bitline 28 orthogonal to the pillar structure. Note that in the present application, the bitline 28 serves as a connection to the subsequently formed bottom electrodes 12. It is also noted that each top electrode 16 will serve as a wordline of the memory structure of the present application. The bitline 28 can include a bitline hard mask cap 30 located on a topmost surface thereof. Although not shown this drawing, but illustrated in FIGS. 11A, 11B and 11C, it is possible to remove the hard mask 22 from the pillar structure anytime prior to forming the bitline 28. In embodiments, more than one bitline can be formed (see, for example, 11A, 11B and 11C in which a first bitline 28A is formed and a second bitline 28B is formed).

Each bitline 28 is composed of a conductive material including, for example, copper (Cu), ruthenium (Ru), cobalt (Co), tungsten (W), aluminum (Al), platinum (Pt) or palladium (Pd). Each bitline 28 that is formed straddles over a portion of the pillar structure and is designed to have innermost sidewalls that contact the bottom electrodes 12. By "straddles over" it is meant the a material/structure is present on a topmost surface and along sidewall surfaces of another material/structure.

The bitline hard mask cap 30 is composed of one of the dielectric hard mask materials mentioned above for hard mask layer 22L. The bitline hard mask cap 30 can have a thickness within the thickness range mentioned above for the hard mask layer 22L.

In some embodiments (as illustrated in FIG. 6), the bitline 28 and the bitline hard mask cap 30 are formed by depositing a blanket layer of a conductive material as defined above for the bitline 28, depositing a blanket layer of a hard mask material, and then patterning those blanket as-deposited layers by lithography and etching.

In other embodiments (not shown), the bitline 28 and the bitline hard mask cap 30 are formed utilizing a damascene process in which an interlayer dielectric material layer (not shown) is first deposition atop and laterally adjacent to the pillar structure shown in FIG. 5. Next, lithography and etching can be used to form at least one bitline contact opening in the interlayer dielectric material layer. A blanket layer of a conductive material, as defined above for the bitline 28, is then formed into the at least one bitline contact opening by a deposition process. A planarization process can follow the deposition of the blanket layer of conductive material to remove any conductive material that is formed outside the at least one bitline contact opening. The remaining conductive material is then recessed to provide bitline 28. Next, the bitline hard mask cap 30 is formed on the recessed conductive material, i.e., bitline 28.

Figure 7:
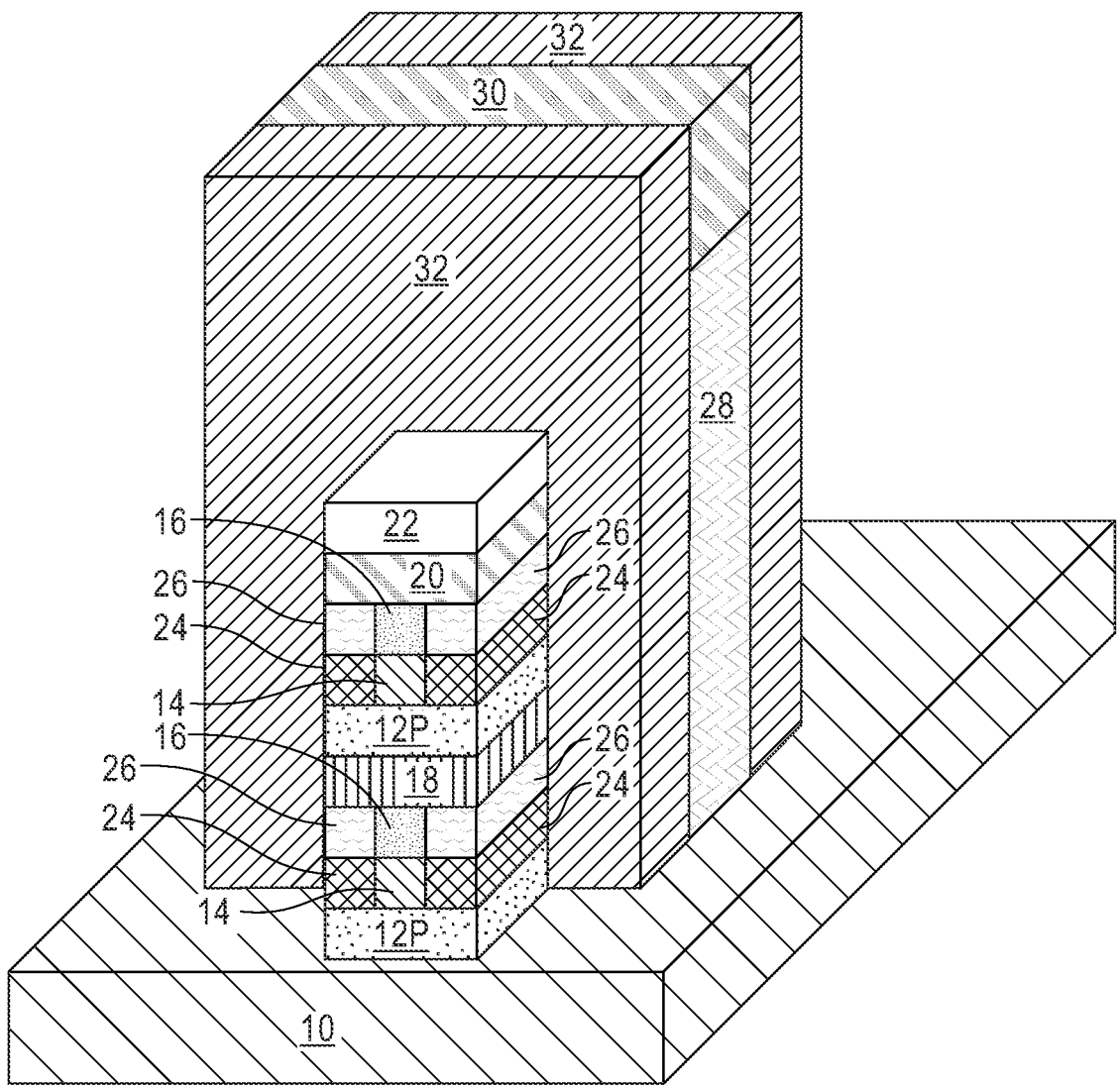
FIG. 7 is a 3D view of the exemplary structure shown in FIG. 6 after forming a bitline dielectric spacer laterally adjacent to the bitline and orthogonal to the pillar structure.

Referring now to FIG. 7, there is illustrated the exemplary structure shown in FIG. 6 after forming a bitline dielectric spacer 32 laterally adjacent to the bitline 28 and orthogonal to the pillar structure. The bitline dielectric spacer 32 straddles over another portion of the pillar structure and serves to protect the bitline 28 during the subsequent processing steps of the present application. The bitline dielectric spacer 32 is composed of a third dielectric spacer material that can be compositionally the same as, or compositionally different from, the first dielectric spacer material and/or the second dielectric spacer material. Illustrative examples of third dielectric spacer materials that can be used in providing the bitline dielectric spacer 32 include, but are not limited to, silicon oxide, SiCO, SiCOH, silicon nitride or silicon oxynitride. The forming of the bitline dielectric spacer 32 includes deposition of the third dielectric spacer material, followed by a spacer etching process. It is noted that both the bitline 28 and the bitline dielectric spacer 32 have a bottommost surface that directly contacts a surface of substrate 10.

Figure 8:
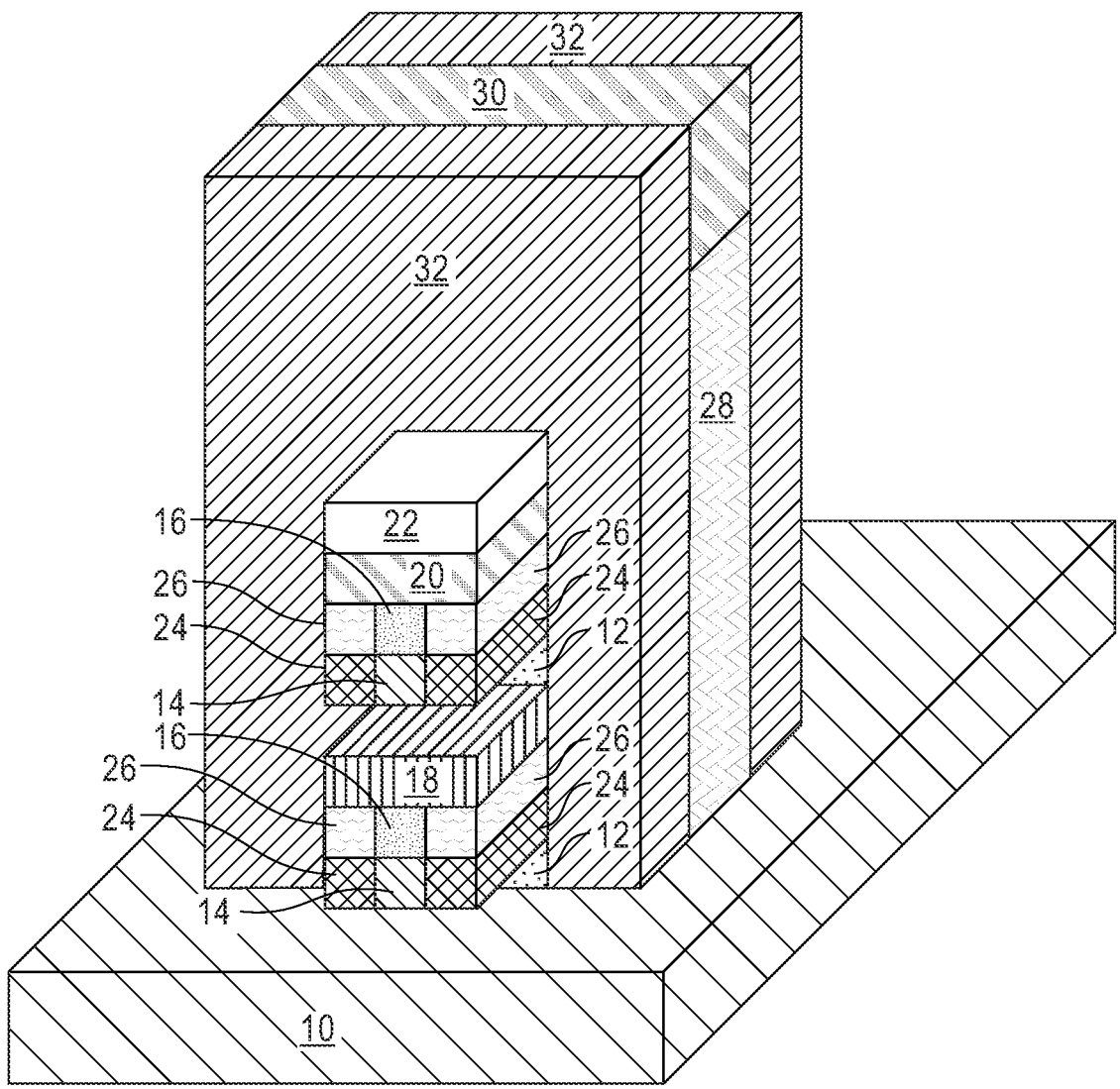
FIG. 8 is a 3D view of the exemplary structure shown in FIG. 7 after isotropically etching each bottom electrode layer portion of the pillar structure to provide a bottom electrode.

Referring now to FIG. 8, there is illustrated the exemplary structure shown in FIG. 7 after isotropically etching each bottom electrode layer portion 12P of the pillar structure to provide bottom electrode 12. This step of the present application cuts each bottom electrode layer portion 12P into an individual segment (i.e., the bottom electrode 12) that is located laterally adjacent to both the bitline 28 and the bitline dielectric spacer 32. See, for example, the exemplary structure shown in FIG. 8. When multiple bitlines 28 and bitline dielectric spacers 32 are formed, this step of the present application cuts each bottom electrode layer portion 12P into a plurality of individual segments (bottom electrodes 12 on a same level), and each individual 'bottom electrode' segment is located laterally adjacent to one of the bitline 28/bitline dielectric spacer 32 structures. See, for example, the exemplary structure shown in FIGS. 11A and 11C of the present application. The isotropically etching is selective in removing portions of the bottom electrode layer portion 12P that are not protected by the bitline 28 and the bitline dielectric spacer 32. This step of the present application enables each individual phase change material element 14 to be addressed independently by a bitline 28 and a wordline (i.e., the top electrode 16). Note that contacts to the top electrode 16 can be made at the edge of the PCM array with staircase contacts similar to 3D NAND.

Each bottom electrode 12 that is formed has a length that is less than the length of the original bottom electrode layer portion 12P; its width remains unchanged. In embodiments, it is possible to segment each bottom electrode layer portion 12P within the pillar structure to provide a plurality of bottom electrodes 12.

Figure 9:
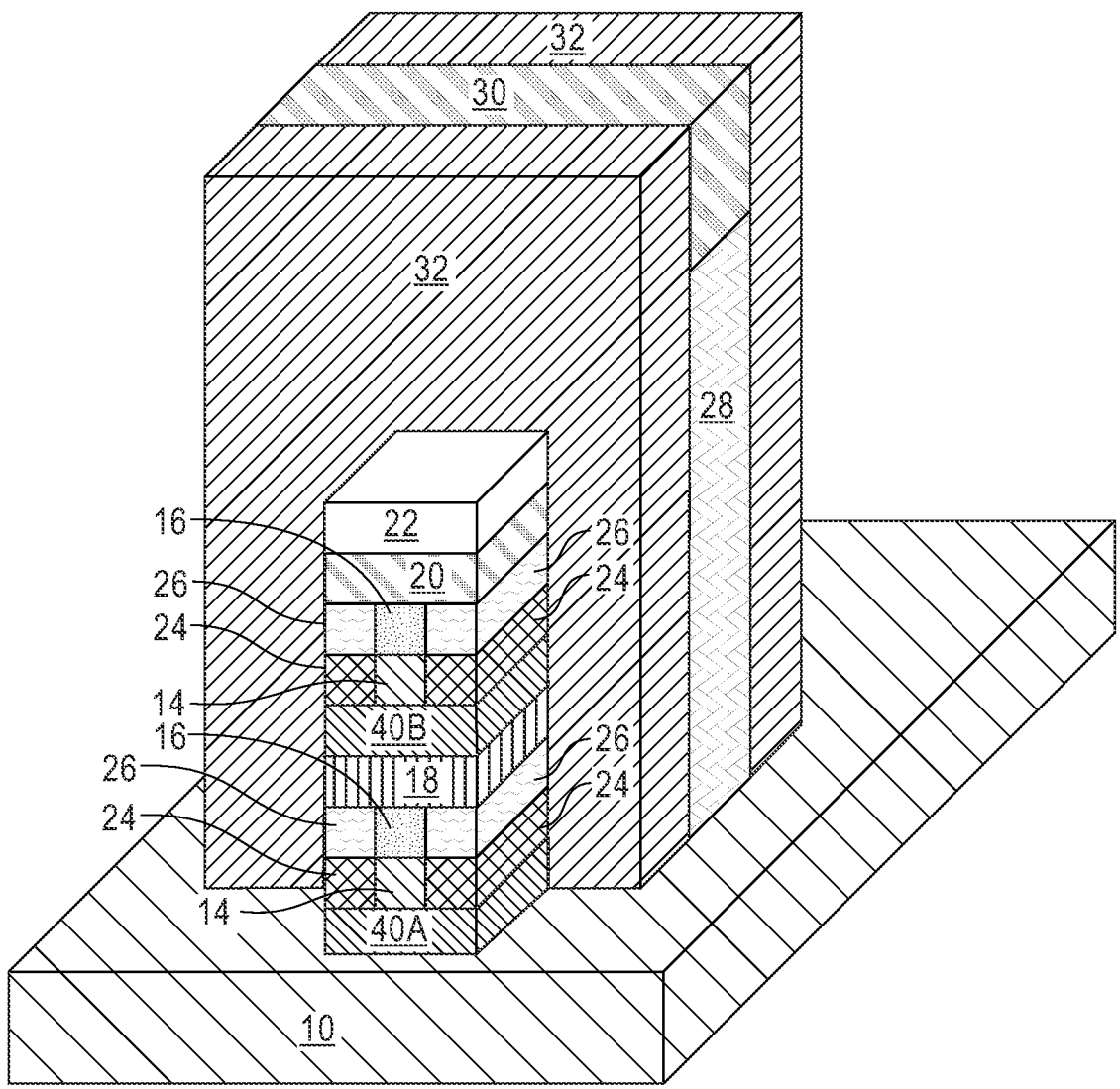
FIG. 9 is a 3D view of the exemplary structure shown in FIG. 8 after forming a dielectric material structure sealing each bottom electrode.

Referring now to FIG. 9, there is illustrated the exemplary structure shown in FIG. 8 after forming a dielectric material structure 40A, 40B sealing each bottom electrode 12. In the drawings dielectric material structure 40A seals the bottommost bottom electrode that is within the pillar structure, while dielectric material structure 40B seals the bottom electrode of the pillar structure that is stacked atop the bottommost bottom electrode. Dielectric material structure 40A, 40B can include any dielectric material such as, for example, silicon oxide, and the dielectric material structure 40A, 40B can be formed by a deposition process followed by an etch back process.

As is illustrated in FIG. 9, a stack of phase change material element-containing structures is provided. In the present application, the term "phase change material element-containing structure" denotes a structure that includes a phase change material element 14 located between a bottom electrode 12 and a top electrode 16. In the phase change material element-containing structure of the present application, the top electrode 16 has width that is less than a width of the bottom electrode 12, and a length that is greater than a length of the bottom electrode 12 (see, for example, FIG. 10C), The width and length of the phase change element 14 in the phase change material element-containing structures are the same the width and length of the top electrode 16. In embodiments, a selector can be present between the phase change material element 14 and the bottom electrode 12, or between the phase change material element 14 and the top electrode 16, or between both the phase change material element 14 and the bottom electrode 12, and the phase change material element 14 and the top electrode 16.

The phase change material element 14 and the top electrode 16 of each phase change material element-containing structure are isolated from the bitline 28 by the first and second dielectric inner spacers, 24 and 26, respectively. Each bottom electrode 12 has a sidewall that contacts the bitline 28; and the bitline 28 contacts a plurality of the bottom electrodes 12 that are stacked one atop the other. The dielectric material structure 40A, 40B isolates bottom electrodes 12 within a same level from adjacent bottom electrodes 12. Also, dielectric material cap 18 isolates the top phase change material element-containing structure from the bottom phase change material-containing structure. These aspects of the present application can be made more apparent by viewing the exemplary structure shown in FIG. 10A. Notably, FIG. 10A illustrates the exemplary structure shown in FIG. 9 showing only the two vertically stacked phase change material element-containing structures in which each phase change material element-containing structure contains a single PCM cell.

Figure 10B:
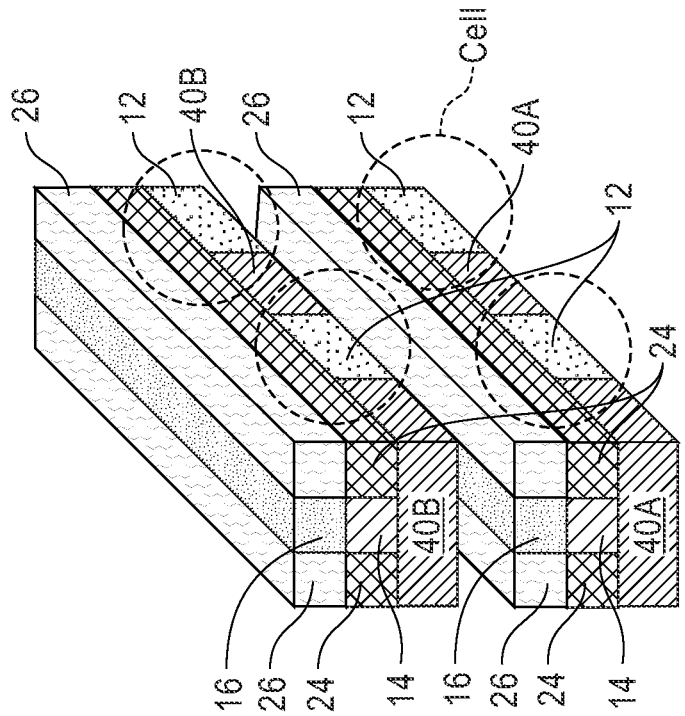
FIG. 10B is a 3D view of another exemplary structure including two vertically stacked phase change material element-containing structures in which each phase change material element-containing structure includes 2 PCM cells.
Figure 10A:
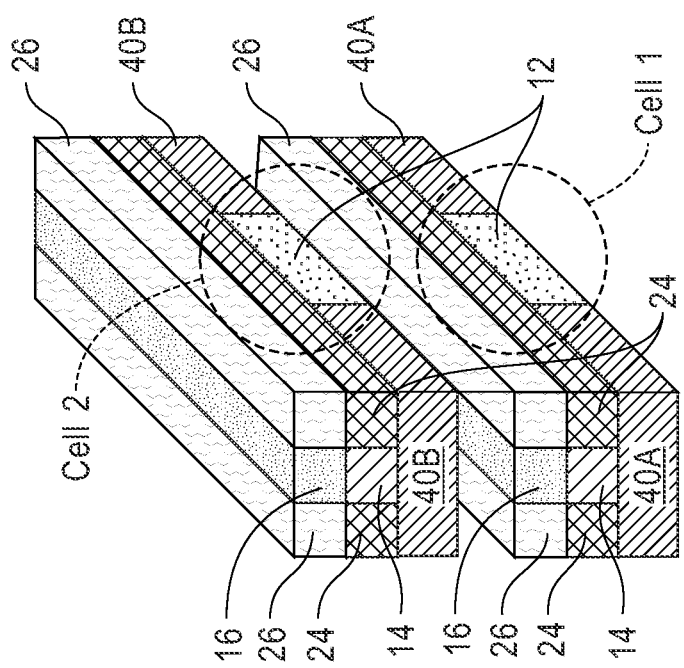
FIG. 10A is a 3D view of the exemplary structure shown in FIG. 9 illustrating only the two vertically stacked phase change material element-containing structures in which each phase change material element-containing structure contains a single PCM cell.

Reference is now made to FIG. 10B, there is illustrated another exemplary structure including two vertically stacked phase change material element-containing structures in which each phase change material element-containing structure includes 2 PCM cells. The illustrated structure provides a 2×2 memory structure.

Figure 10D:
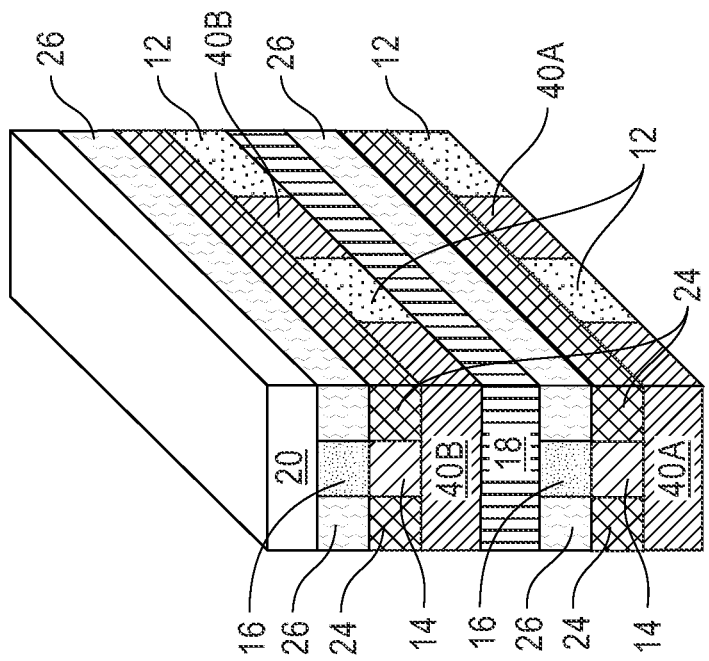
FIG. 10D is a 3D view of the another exemplary structure shown in FIG. 10C illustrating the various dielectric layers/materials that are present.
Figure 10C:
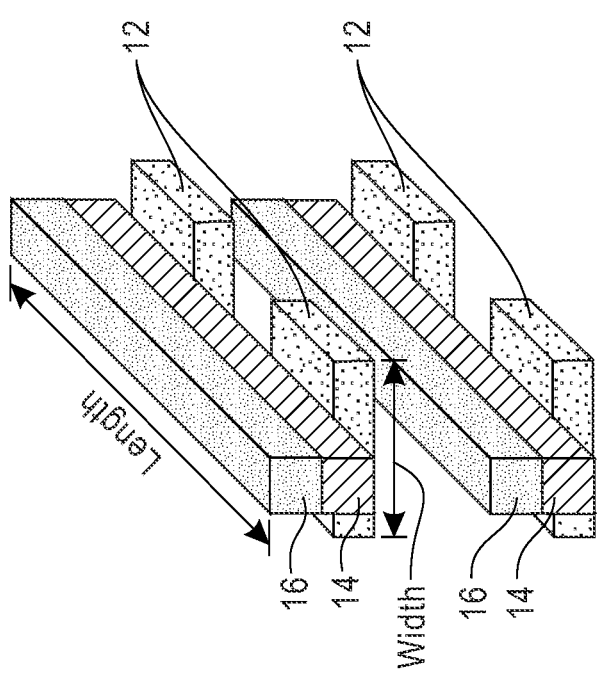
FIG. 10C is a 3D view of the another exemplary structure shown in FIG. 10B illustrating only the bottom electrodes, the phase change material elements and the top electrodes of two vertically stacked phase change material element-containing structures.

Reference is now made to FIG. 10C, there is illustrated the another exemplary structure shown in FIG. 10B illustrating only the bottom electrodes 12, the phase change material elements 14 and the top electrodes 16 of two vertically stacked phase change material element-containing structures. This structure is provided to show that each phase change material element-containing structure has a cross-point architecture in which the top electrode 16 is narrower than the bottom electrode 12. Reference is now made to FIG. 10D, which illustrated the another exemplary structure shown in FIG. 10C illustrating the various dielectric materials/layers of two vertically stacked phase change material element-containing structures.

Figure 11B:
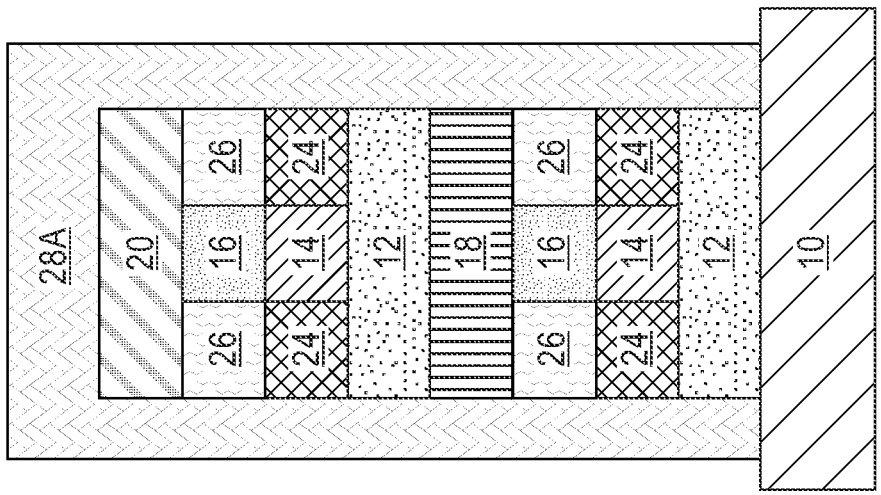
FIG. 11B is a cross sectional view of the another exemplary structure shown in FIG. 11A.
Figure 11A:
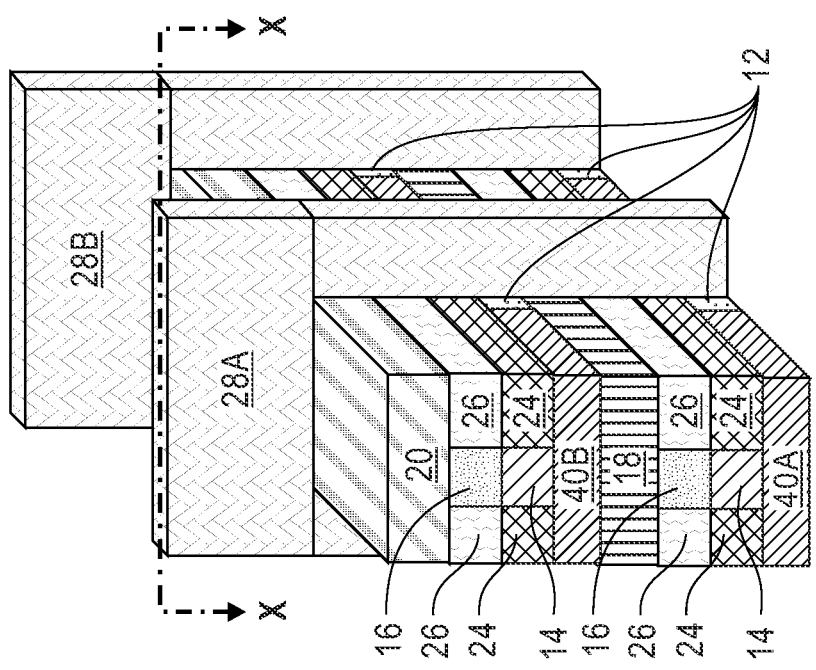
FIG. 11A is a 3D view of the another exemplary structure shown in FIG. 10D illustrating a pair of bitlines straddling over the two vertically stacked phase change material element-containing structures.
Figure 11C:
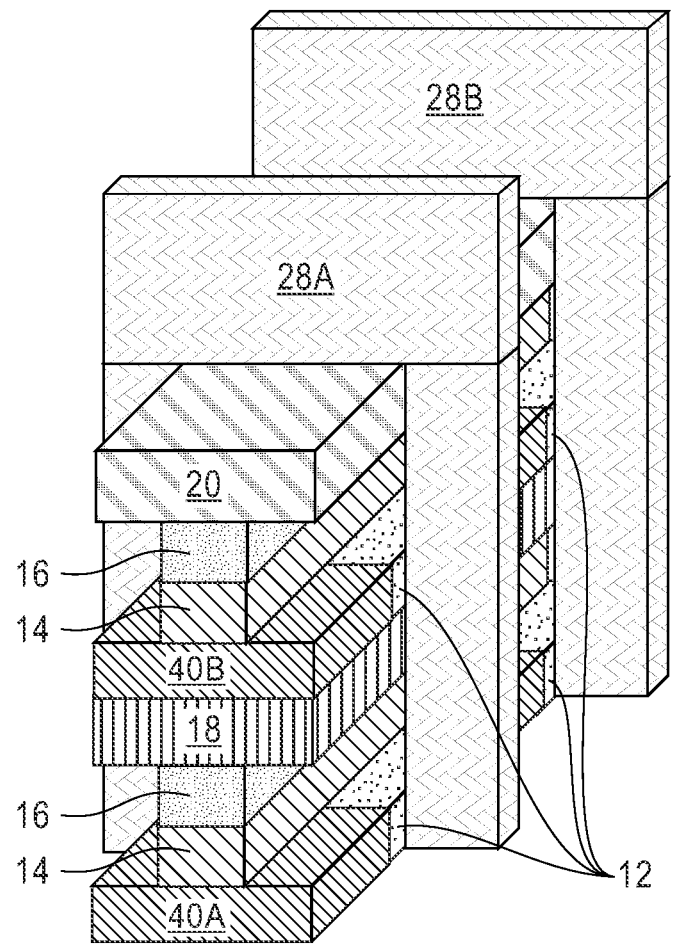
FIG. 11C is a 3D view of the another exemplary structure shown in FIG. 11A without the first dielectric inner spacer and the second dielectric inner spacer.

Reference is finally made to FIGS. 11A, 11B and 11C, there is illustrated the another exemplary structure shown in FIG. 10D illustrating a pair of bitlines 28A, 28B straddling over the two vertically stacked phase change material element-containing structures. FIG. 11A includes cross sectional X-X which is illustrated in FIG. 11B. FIG. 11C shows the another exemplary structure shown in FIG. 11A without the first dielectric inner spacer 24 and the second dielectric inner spacer 26.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a plurality of phase change material element-containing structures stacked one atop the other, wherein each phase change material element-containing structure of the plurality of phase change material element-containing structures has a cross-point architecture and comprises, from bottom to top, at least one bottom electrode, a phase change material element, and a top electrode; and
    at least one bitline located orthogonal to each phase change material element-containing structure of the plurality of phase change material element-containing structures, wherein the at least one bitline has an inner sidewall that is in direct physical contact with a sidewall of the at least one bottom electrode of each phase change material element-containing structure of the plurality of phase change material element-containing structures.

2. The memory structure of claim 1, further comprising:
    a first inner dielectric spacer located laterally adjacent to the phase change material element of each phase change material element-containing structure of the plurality of phase change material element-containing structures; and
    a second inner dielectric spacer located atop the first inner dielectric spacer and laterally adjacent to the top electrode of each phase change material element-containing structure of the plurality of phase change material element-containing structures, wherein the first inner dielectric spacer separates each phase change material element from the at least one bitline, and wherein the second inner dielectric spacer separates each top electrode from the at least one bitline.

3. The memory structure of claim 1, further comprising a dielectric material cap located between each phase change material element-containing structure of the plurality of phase change material element-containing structures, and atop a topmost phase change material element-containing structure of the plurality of phase change material element-containing structures.

4. The memory structure of claim 1, further comprising a dielectric material structure located on opposite sides of the at least one bottom electrode of each phase change material element-containing structure of the plurality of phase change material element-containing structures.

5. The memory structure of claim 1, wherein the top electrode of each phase change material element-containing structure of the plurality of phase change material element-containing structures has a width that is less than a width of the at least one bottom electrode of each phase change material element-containing structure of the plurality of phase change material element-containing structure, and a length that is greater than a length of the at least one bottom electrode of each phase change material element-containing structure of the plurality of phase change material element-containing structures.

6. The memory structure of claim 5, wherein the phase change material element of each phase change material element-containing structure of the plurality of phase change material element-containing structures has a width and length that is the same as the width and length of the top electrode of each phase change material element-containing structure of the plurality of phase change material element-containing structures.

7. The memory structure of claim 1, wherein the at least one bottom electrode of each phase change material element-containing structure comprises a plurality spaced apart bottom electrodes, and the at least one bitline comprises a plurality of bitlines, wherein each bitline of the plurality of bitlines is in direct physical contact with a sidewall of one of the spaced apart bottom electrodes.

8. The memory structure of claim 1, wherein the bottom electrode of each phase change material element-containing structure of the plurality of phase change material element-containing structures comprises a first electrically conductive electrode material, and the top electrode of each phase change material element-containing structure of the plurality of phase change material element-containing structures comprises a second electrically conductive electrode material that is compositionally different from the first electrically conductive electrode material.

9. The memory structure of claim 1, further comprising a selector located between the phase change memory element of each phase change material element-containing structure of the plurality of phase change material element-containing structures and at least one of the bottom electrode and the top electrode.

10. The memory structure of claim 1, wherein the phase change memory element of each phase change material element-containing structure of the plurality of phase change material element-containing structures comprises a material that undergoes a phase change from crystalline to amorphous or vice versa when energy is applied thereto.

11. The memory structure of claim 10, wherein the material that undergoes the phase change comprises a GeSbTe alloy (GST), a SbTe alloy, an InSe alloy, $Cr_2Ge_2Te_6$ (CrGeT), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, or any combination thereof.

12. The memory structure of claim 1, further comprising a bitline cap located on at least one bitline.

13. The memory structure of claim 1, further comprising a bitline dielectric spacer located laterally adjacent to the at least one bitline.

14. A memory structure comprising:
a plurality of phase change material element-containing structures stacked one atop the other, wherein each phase change material element-containing structure of the plurality of phase change material element-containing structures has a cross-point architecture and comprises, from bottom to top, a plurality of spaced apart and electrically isolated bottom electrodes, a phase change material element, and a top electrode; and
a plurality bitlines located orthogonal to each phase change material element-containing structure of the plurality of phase change material element-containing structures, wherein each bitline of the plurality of bitlines has an inner sidewall that is in direct physical contact with a sidewall of one of the bottom electrodes of the plurality of spaced apart and electrically isolated bottom electrodes of each phase change material element-containing structure of the plurality of phase change material element-containing structures.

15. The memory structure of claim 14, further comprising:
a first inner dielectric spacer located laterally adjacent to the phase change material element of each phase change material element-containing structure of the plurality of phase change material element-containing structures;
a second inner dielectric spacer located atop the first inner dielectric spacer and laterally adjacent to the top electrode of each phase change material element-containing structure of the plurality of phase change material element-containing structures, wherein the first inner dielectric spacer separates each phase change material element from the at least one bitline, and wherein the second inner dielectric spacer separates each top electrode from the at least one bitline;
a dielectric material cap located between each phase change material element-containing structure of the plurality of phase change material element-containing structures, and atop a topmost phase change material element-containing structure of the plurality of phase change material element-containing structures; and
a dielectric material structure located on opposite sides of each bottom electrode of the plurality of spaced apart and electrically isolated bottom electrodes of each phase change material element-containing structure of the plurality of phase change material element-containing structures.

16. A method of forming a semiconductor structure, the method comprising:
forming a pillar structure containing a plurality of stacked phase change memory (PCM)-containing material stacks, wherein each PCM-containing material stack is spaced apart by a dielectric material layer, and includes a bottom electrode layer portion, a phase change material layer portion, and a top electrode layer portion;
laterally recessing each phase change material layer portion of the pillar structure to provide a phase change material element;
forming a first dielectric inner spacer laterally adjacent to each phase change material element;
laterally recessing each top electrode layer portion of the pillar structure to provide a top electrode;
forming a second dielectric inner spacer laterally adjacent to each top electrode,
forming at least one bitline orthogonal to the pillar structure;
isotropically etching each bottom electrode layer portion of the pillar structure utilizing the at least one bitline as an etch mask to provide at least one bottom electrode; and
forming a dielectric material structure sealing each bottom electrode.

17. The method of claim 16, wherein each top electrode has a width that is less than a width of the at least one bottom electrode, and a length that is greater than a length of the at least one bottom electrode.

18. The method of claim 17, wherein each phase change material element has a width and length that is the same as the width and length of each top electrode.

19. The method of claim 16, wherein the bottom electrode layer portion comprises a first electrically conductive electrode material, and the top electrode layer portion comprises a second electrically conductive electrode material that is compositionally different from the first electrically conductive electrode material.

20. The method of claim 16, further comprising forming a bitline dielectric spacer laterally adjacent to the at least one bitline, wherein the forming of the bitline dielectric spacer occurs prior to isotropically etching each bottom electrode layer portion of the pillar structure.

\* \* \* \* \*